United States Patent
Cai et al.

(10) Patent No.: US 8,855,233 B2
(45) Date of Patent: Oct. 7, 2014

(54) METHOD AND APPARATUS FOR IMPLEMENTING DIGITAL BASEBAND PREDISTORTION

(71) Applicant: Huawei Technologies Co., Ltd., Guangdong (CN)

(72) Inventors: Hua Cai, Chengdu (CN); Yanzhao Pang, Chengdu (CN); Wei Wang, Chengdu (CN); Wei Xue, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/731,723

(22) Filed: Dec. 31, 2012

(65) Prior Publication Data

US 2013/0121440 A1    May 16, 2013

Related U.S. Application Data

(63) Continuation of application No. PCT/CN2012/071073, filed on Feb. 13, 2012.

(30) Foreign Application Priority Data

Feb. 25, 2011 (CN) .......................... 2011 1 0048111

(51) Int. Cl.
| | |
|---|---|
| *H03F 1/32* | (2006.01) |
| *H04L 25/03* | (2006.01) |
| *H04L 27/36* | (2006.01) |
| *H04B 7/005* | (2006.01) |

(52) U.S. Cl.
CPC ........ *H04L 25/03343* (2013.01); *H04L 27/368* (2013.01); *H03F 1/3247* (2013.01)
USPC ........... 375/297; 375/296; 375/295; 330/149; 455/114.3; 455/114.2; 455/91; 455/126

(58) Field of Classification Search
USPC ........... 330/149; 375/297, 296, 295; 455/126, 455/127.1, 127.2, 91, 114.3, 114.2
See application file for complete search history.

(56) References Cited

U.S. PATENT DOCUMENTS 4,412,337 A * 10/1983 Bickley et al. ................ 375/297
5,732,333 A    3/1998 Cox et al.

(Continued)

FOREIGN PATENT DOCUMENTS

| CN | 1870614 A | 11/2006 |
|---|---|---|
| CN | 101022434 A | 8/2007 |

(Continued)

OTHER PUBLICATIONS

Reinhardt, V.S.; Shih, Y. C.; Toth, P.A.; Reynolds, S.C.; Berman, A.L., "Methods for measuring the power linearity of microwave detectors for radiometric applications," Microwave Symposium Digest, 1994., IEEE MTT-S International , vol., No., pp. 1477,1480 vol. 3, May 23-27, 1994.*

(Continued)

*Primary Examiner* — Chieh M Fan
*Assistant Examiner* — Michelle M Koeth

(57) ABSTRACT

An apparatus for implementing digital baseband predistortion includes a transmission channel including a digital-to-analog converter, a modulator, an amplifier and a power amplifier, and further includes a feedback channel analog part including a diode detector, a filter and an analog-to-digital converter, and a feedback channel digital part including a predistorter, a mode obtaining unit, a predistortion coefficient generator and a feedback correcting unit. The diode detector is configured to obtain an envelope of an output signal of the power amplifier. Embodiments of the present invention further provide a method for implementing digital baseband predistortion by applying the foregoing single-chip. Due to a simple structure of the diode detector, not only the number of radio frequency devices on the feedback channel is reduced, implementation complexity of hardware is lowered, power consumption is reduced, but also a feedback channel analog part may be integrated onto the single-chip.

4 Claims, 3 Drawing Sheets

(56) References Cited

U.S. PATENT DOCUMENTS

| | | | |
|---|---|---|---|
| 6,112,062 A | 8/2000 | Hans et al. | |
| 6,566,948 B1 | 5/2003 | Braithwaite | |
| 6,801,582 B2 | 10/2004 | Hovakimyan | |
| 6,973,138 B1 | 12/2005 | Wright | |
| 2003/0095607 A1 | 5/2003 | Huang et al. | |
| 2004/0017859 A1 | 1/2004 | Sills et al. | |
| 2004/0263245 A1* | 12/2004 | Winter et al. | 330/10 |
| 2006/0229036 A1* | 10/2006 | Muller et al. | 455/114.3 |
| 2010/0220810 A1 | 9/2010 | Jin et al. | |

FOREIGN PATENT DOCUMENTS

| | | |
|---|---|---|
| CN | 101072220 A | 11/2007 |
| CN | 101184070 A | 5/2008 |
| CN | 101634697 A | 1/2010 |
| CN | 101635697 A | 1/2010 |
| CN | 102143107 A | 8/2011 |
| EP | 1 819 041 A1 | 8/2007 |
| EP | 2 086 194 A2 | 8/2009 |
| WO | WO 2008/116402 A1 | 10/2008 |

OTHER PUBLICATIONS

The ARRL Handbook for Radio Communications 2011, Oct. 2010, Amateur Radio Relay League (ARRL), Edition 88, pp. 10.8-10.9.*
Search Report dated Feb. 21, 2013 in connection with Chinese Patent Application No. 201110048111.6.
International Search Report dated May 17, 2012 in connection with International Patent Application No. PCT/CN2012/071073.
Communication dated Sep. 16, 2013 in connection with European Patent Application No. 12 749 385.6.

* cited by examiner

US 8,855,233 B2

METHOD AND APPARATUS FOR IMPLEMENTING DIGITAL BASEBAND PREDISTORTION

CROSS-REFERENCE TO RELATED APPLICATIONS

This application is a continuation of International Application No. PCT/CN2012/071073, filed on Feb. 13, 2012, which claims priority to Chinese Patent Application No. 201110048111.6, filed on Feb. 25, 2011, both of which are hereby incorporated by reference in their entireties.

TECHNICAL FIELD

The embodiments of present invention relate to the field of communications technology, and in particular, to a method and an apparatus for implementing digital baseband predistortion.

BACKGROUND

A transmission channel single-chip integration technology is conducive to microwave point-to-point equipment developing towards a direction of high frequency, high integration level, low cost and low power consumption. However, due to semiconductor technologies, comparing a device adopting the transmission channel single-chip integration with an independent single-function device, a linear output power level of the transmission channel of the device adopting the transmission channel single-chip integration may be reduced. In order to keep the same output power with the conventional single-function device, a linearization process needs to be performed on the device adopting the transmission channel single-chip integration.

A predistortion (predistortion) technology is an implementation manner of linearization. Nonlinear distortion exists in the device adopting the transmission channel single-chip integration. An operating principle of the predistortion technology is to superpose distortion opposite to the nonlinear distortion of the device onto the input signal, so as to counteract the nonlinear distortion of the device. The distortion opposite to the nonlinear distortion of the device can be obtained according to a nonlinear distortion characteristic of a power amplifier. Digital baseband predistortion is a relatively widely applied predistortion technology. In an existing digital baseband predistortion system, a feedback channel is implemented by a super-heterodyne receiver.

The prior art at least has the following problems.

A digital baseband predistortion system adopting a super-heterodyne down-conversion structure means to add a receiving channel. What is fed back by a super-heterodyne receiver is an output signal of a power amplifier. In a microwave system, a carrier frequency of the output signal of the power amplifier is high, considering existing semiconductor technologies, for application in a high carrier frequency condition, an implementation structure of the super-heterodyne receiver adopted by the feedback channel is complex, and a hardware cost is high. In addition, due to complex frequency components of the super-heterodyne receiver itself, in order to shield internal signal leakage in the super-heterodyne receiver, the implementation structure is more complex. Therefore, the feedback channel is difficult to be integrated onto a single-chip together with the transmission channel.

SUMMARY

Embodiments of the present invention provide a method and an apparatus for implementing digital baseband predistortion, to prevent that a feedback channel for the digital baseband predistortion has a complex implementation structure and a high hardware cost.

The objectives of the present invention are achieved through the following technical solutions.

An apparatus for implementing digital baseband predistortion includes a transmission channel including a digital-to-analog converter, a modulator, an amplifier and a power amplifier. The apparatus further includes:

a feedback channel analog part including a diode detector, a filter and an analog-to-digital converter, and a feedback channel digital part including a predistorter, a mode obtaining unit, a predistortion coefficient generator and a feedback correcting unit;

the diode detector is configured to obtain an envelope of an output signal of the power amplifier;

the filter is connected with the diode detector, and is configured to filter the envelope obtained by the diode detector;

the analog-to-digital converter is connected with the filter, and is configured to perform analog-to-digital conversion on an output signal of the filter;

the mode obtaining unit is configured to obtain a mode of an input signal of the apparatus;

the feedback correcting unit is connected with the analog-to-digital converter, and is configured to obtain an output signal of the analog-to-digital converter, and to perform the nonlinear correction processing of a feedback channel on the output signal of the analog-to-digital converter;

the predistortion coefficient generator is connected with the mode obtaining unit and the feedback correcting unit, obtains an output signal of the mode obtaining unit and an output signal of the feedback correcting unit, and obtains signal distortion of the transmission channel according to the obtained output signal of the mode obtaining unit and the obtained output signal of the feedback correcting unit;

the predistorter is connected with the predistortion coefficient generator and the digital-to-analog converter, and is configured to perform digital baseband predistortion processing on the input signal of the apparatus according to the signal distortion of the transmission channel output by the predistortion coefficient generator, and to send an output signal after the digital baseband predistortion processing to the digital-to-analog converter.

A method for implementing digital baseband predistortion processing by applying the foregoing apparatus includes:

obtaining, by a diode detector in a feedback channel, an output signal of a power amplifier in a transmission channel;

performing detecting, by the diode detector, to obtain an envelope of the output signal of the power amplifier;

performing, by an analog-to-digital converter in the feedback channel, analog-to-digital conversion on the envelope;

performing, by a feedback correcting unit in the feedback channel, nonlinear correcting processing of the feedback channel on the signal output after the analog-to-digital converter performs the analog-to-digital conversion;

obtaining, by a predistortion coefficient generator in the feedback channel, signal distortion of the transmission channel according to a mode of the obtained input signal of the apparatus and the signal output after the feedback correcting unit performs the nonlinear correction processing;

performing, by a predistorter in the feedback channel, digital baseband predistortion processing on the input signal of the apparatus according to the signal distortion of the transmission channel.

It can be seen from the technical solutions provided by embodiments of the present invention that, in the embodiments of the present invention, an envelope of a power amplifier is fed back by a diode detector, which is not restricted and affected by a carrier frequency, so the diode detector can be applied to a feedback channel of digital baseband predistortion without the need of adding radio frequency devices for adapting a high carrier frequency, and a structure of the diode detector is simple, so not only the number of radio frequency devices on the feedback channel is reduced, implementation complexity of hardware is lowered, power consumption is reduced, but also a feedback channel analog part may be integrated onto a single-chip.

BRIEF DESCRIPTION OF THE DRAWINGS

To illustrate the technical solutions in the embodiments of the present invention more clearly, the accompanying drawings required for describing the embodiments are introduced below briefly. Apparently, the accompanying drawings in the following descriptions merely show some of the embodiments of the present invention, and persons of ordinary skill in the art can obtain other drawings according to the accompanying drawings without creative efforts.

DETAILED DESCRIPTION

The technical solutions of the embodiments of the present invention are hereinafter described clearly and completely with reference to the accompanying drawings in the embodiments of the present invention. Evidently, the described embodiments are only some exemplary embodiments of the present invention, rather than all embodiments of the present invention. All other embodiments obtained by persons of ordinary skill in the art based on the embodiments of the present invention without creative efforts shall fall within the protection scope of the present invention.

Figure 1:
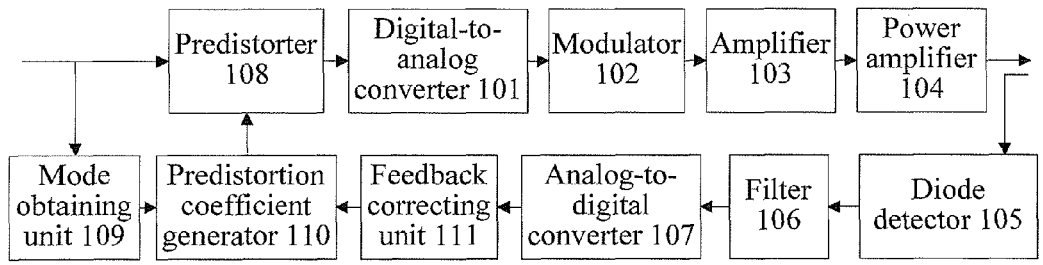
FIG. 1 is a schematic structural diagram of an apparatus provided by an embodiment of the present invention.

An embodiment of the present invention provides an apparatus for implementing digital baseband predistortion. A structure is shown in FIG. 1. A specific implementation structure includes:

a transmission channel including a digital-to-analog converter 101, a modulator 102, an amplifier 103 and a power amplifier 104;

a feedback channel analog part including a diode detector 105, a filter 106 and an analog-to-digital converter 107;

and a feedback channel digital part including a predistorter 108, a mode obtaining unit 109, a predistortion coefficient generator 110 and a feedback correcting unit 111.

The apparatus provided by the embodiment of the present invention may be a transmitter, and may also be a part of hardware component units in the transmitter.

In the embodiment of the present invention, the apparatus may be implemented by using an existing diode detector.

A connection relationship and an operating principle for each part of a feedback channel in the apparatus provided by the embodiment of the present invention are described below in combination with FIG. 1:

the diode detector 105 is configured to obtain an envelope of an output signal of the power amplifier 104;

the filter 106 is connected with the diode detector 105, and is configured to filter the envelope obtained by the diode detector 105;

the analog-to-digital converter 107 is connected with the filter 106, and is configured to perform analog-to-digital conversion on an output signal of the filter 106;

the mode obtaining unit 109 is configured to obtain a mode of an input signal of the apparatus;

the feedback correcting unit 111 is connected with the analog-to-digital converter 107, and is configured to obtain an output signal of the analog-to-digital converter 107, and to perform nonlinear correction processing of a feedback channel on the output signal of the analog-to-digital converter 107;

the predistortion coefficient generator 110 is connected with the mode obtaining unit 109 and the feedback correcting unit 111, obtains an output signal of the mode obtaining unit 109 and an output signal of the feedback correcting unit 114, and obtains signal distortion of the transmission channel according to the obtained output signal of the mode obtaining unit 109 and the obtained output signal of the feedback correcting unit 111;

where a mathematical model of the envelope detected by the diode detector can be equivalent to the mode of the output signal of the power amplifier 104, so that the signal output after the analog-to-digital converter 107 performs the analog-to-digital conversion on the envelope may be equivalent to the mode of the output signal of the power amplifier 104, so as to compare the signal after the analog-to-digital conversion with the output signal of the mode obtaining unit 109 to obtain the signal distortion of the transmission channel;

the predistorter 108 is connected with the predistortion coefficient generator 110 and the digital-to-analog converter 101, and is configured to perform digital baseband predistortion processing on the input signal of the apparatus according to the signal distortion of the transmission channel output by the predistortion coefficient generator 110, and to send an output signal after the digital baseband predistortion processing to the digital-to-analog converter 101.

In the apparatus provided by the embodiment of the present invention, the feedback channel for the digital baseband predistortion is implemented by the diode detector. The envelope of the output signal of the power amplifier is detected by the diode detector, which is not affected by a carrier frequency, and the structure of the diode detector is simple, so not only the number of radio frequency devices on the feedback channel is reduced, implementation complexity of hardware is lowered, power consumption is reduced, but also the feedback channel analog part may be integrated onto a single-chip.

Figure 2:
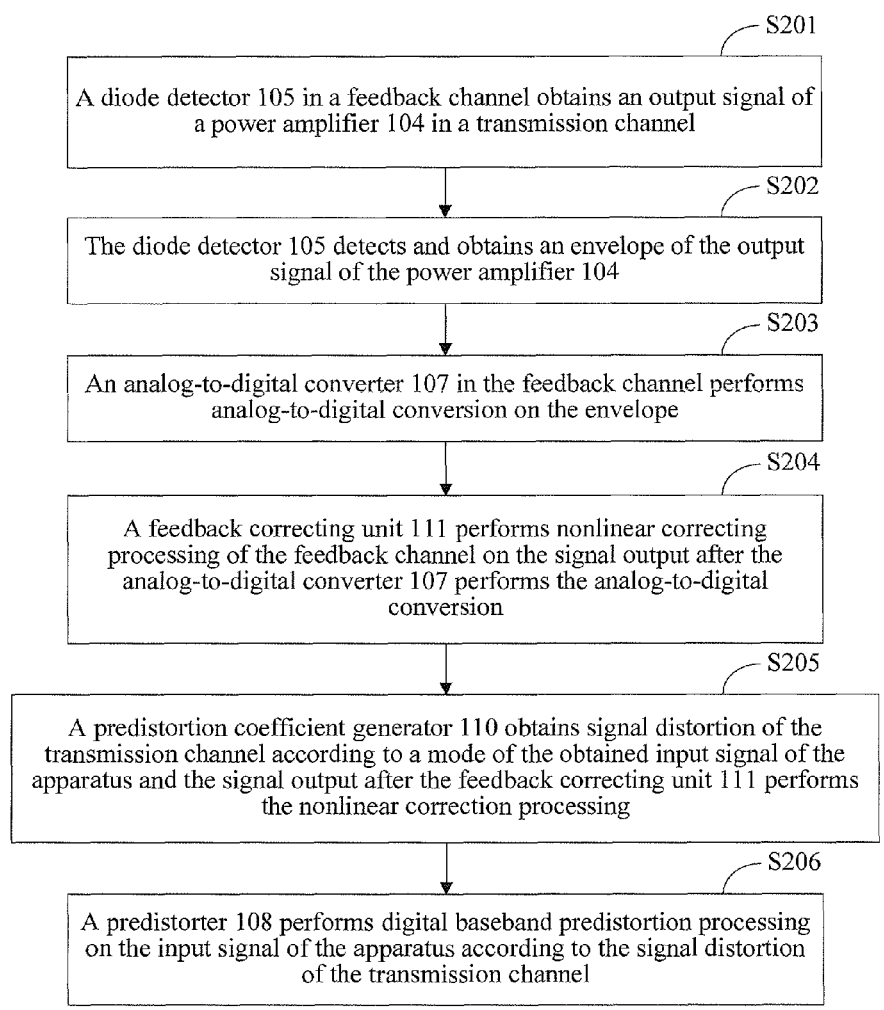
FIG. 2 is a flow chart of a method provided by an embodiment of the present invention.

An embodiment of the present invention further provides a method for implementing digital baseband predistortion based on the apparatus. An implementation manner is shown in FIG. 2, and the following operations are specifically included:

S201: A diode detector 105 in a feedback channel obtains an output signal of a power amplifier 104 in a transmission channel;

S202: The diode detector 105 performs detection to obtain an envelope of the output signal of the power amplifier 104;

S203: An analog-to-digital converter 107 in the feedback channel performs analog-to-digital conversion on the envelope;

S204: A feedback correcting unit 111 performs nonlinear correcting processing of the feedback channel on the signal output after the analog-to-digital converter 107 performs the analog-to-digital conversion;

S205: A predistortion coefficient generator 110 obtains signal distortion of the transmission channel according to a mode of the obtained input signal of the apparatus and the signal output after the feedback correcting unit 111 performs the nonlinear correction process; and S206: A predistorter 108 performs digital baseband predistortion processing on the input signal of the apparatus according to the signal distortion of the transmission channel.

Due to the nonlinear characteristic of the diode detector 105, the nonlinear distortion generated in the feedback channel by the diode detector 105 needs to be corrected. In order to obtain the correction coefficient of the diode detector 105, before S201, the method provided by the embodiment of the present invention further includes:

controlling an output power of the power amplifier 104 to operate at a linear interval; obtaining a nonlinear distortion parameter of the diode detector 105; and obtaining a correction coefficient of the diode detector 105 according to the nonlinear distortion parameter. A series of operations for obtaining the correction coefficient of the diode detector can be specifically implemented by a processor that has operating and controlling abilities in the apparatus. After the correction coefficient of the diode detector is obtained, a transmission power of the power amplifier 104 is adjusted to a nonlinear interval to enable the apparatus to operate normally, so as to perform a digital baseband predistortion operation on the input signal. Accordingly, a specific implementation manner of S204 can be: the feedback correcting unit 111 corrects the nonlinear distortion of the diode detector in the envelope according to the correction coefficient of the diode detector.

The specific implementation of the embodiment of the present invention in practical applications is described in detail below.

In combination with the apparatus provided by the embodiment of the present invention, an implementation principle of the digital baseband predistortion is illustrated below.

Because a linear gain part of a signal does not affect the nonlinear characteristic of the signal, while the nonlinear distortion characteristic of the signal is concerned in the embodiment of the present invention, in the embodiment of the present invention, a state formula of the signal in the channel is simplified, and the linear gain part is ignored.

The input signal of the apparatus is represented as $I+j*Q$;

a mathematical model of the modulated signal obtained after the input signal is modulated by the modulator 102 is $I*\cos wt+Q*\sin wt$, where $w$ is a carrier angular frequency;

a linear gain is generated after the modulated signal passes through the amplifier, and a mathematical model of the distorted signal obtained after the signal passes through the power amplifier 104 is $I_d*\cos wt+Q_d*\sin wt$;

a result of detecting the distorted signal by an ideal envelope detector should be $\sqrt{I_d^2+Q_d^2}$, where the ideal envelope detector means that no nonlinear distortion exists in the envelope detector.

It is assumed that a transfer function of the power amplifier is H, $H(I*\cos wt+Q*\sin wt)=I_d*\cos wt+Q_d*\sin wt$ (formula 1), where H represents the nonlinear characteristic of the power amplifier. The transfer function H may be obtained through the known I, Q and the fed back $\sqrt{I_d^2+Q_d^2}$; an inverse function of H is taken as the transfer function of the predistorter 107, so as to perform predistortion on the input signal based on the transfer function, so that the nonlinear distortion of the power amplifier can be corrected.

Because the diode detector 105 is not an ideal envelope detector, and the diode detector itself has the nonlinear characteristic, its nonlinear transfer function is represented as D.

A mathematical model of the actual output signal of the diode detector is $\sqrt{I_1^2+Q_1^2}$, so that a relationship between the actual output signal and the output signal of the ideal envelope detector can be represented as $\sqrt{I_1^2+Q_1^2}=D(\sqrt{I_d^2+Q_d^2})$ (formula 2). In order to implement digital baseband predistortion, it needs to ensure that no nonlinear distortion exists in the feedback channel. In the apparatus provided by the embodiment of the present invention, neither of the filter 106 and the analog-to-digital converter 107 may generate nonlinear distortion. Therefore, it only needs to correct the nonlinear distortion of the diode detector 105. The principle is to take the inverse function of D as the correction coefficient to correct the nonlinear distortion of the diode detector.

The total transfer function of the feedback channel must be linear, if the nonlinear response D of a diode may be extracted independently, a feedback correcting unit can be added into a digital part to perform correction. After the correction, what is obtained is the output signal of the ideal envelope detector.

Figure 3:
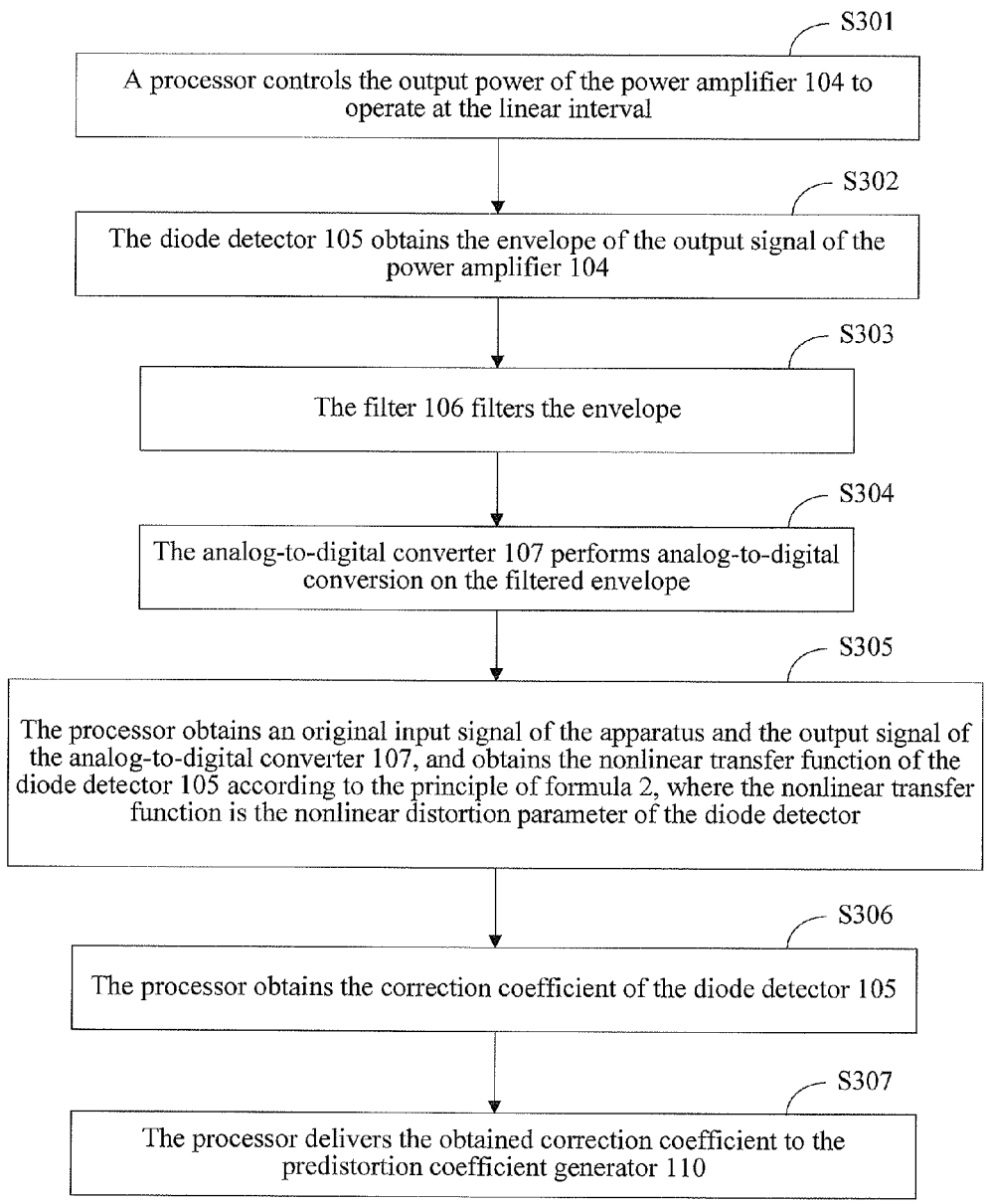
FIG. 3 is a flow chart of a method for obtaining a correction coefficient of a diode detector provided by an embodiment of the present invention.

According to the principle, before the digital baseband predistortion processing is performed, the correction coefficient of the diode detector needs to be learned first, so as to perform the nonlinear correction for the feedback channel. An implementation manner of obtaining the correction coefficient of the diode detector is shown in FIG. 3, and the following operations are specifically included:

S301: A processor controls the output power of the power amplifier 104 to operate at a linear interval;

S302: The diode detector 105 obtains the envelope of the output signal of the power amplifier 104;

S303: The filter 106 filters the envelope;

S304: The analog-to-digital converter 107 performs analog-to-digital conversion on the filtered envelope;

S305: The processor obtains an original input signal of the apparatus and the output signal of the analog-to-digital converter 107, and obtains the nonlinear transfer function D of the diode detector 105 according to the principle of formula 2, where D is the nonlinear distortion parameter of the diode detector;

the power amplifier 104 operates at the linear interval, so the power amplifier 104 does not generate the nonlinear distortion, a mathematical model of the envelope detected by the diode detector 105 is $\sqrt{I^2+Q^2}$, and a relationship between the actual output signal and the output signal of the ideal envelope detector can be represented as $\sqrt{I_1^2+Q_1^2}=D(\sqrt{I^2+Q^2})$;

S306: The processor obtains the correction coefficient of the diode detector 105 according to D;

S307: The processor delivers the obtained correction coefficient to the predistortion coefficient generator 110.

Figure 4:
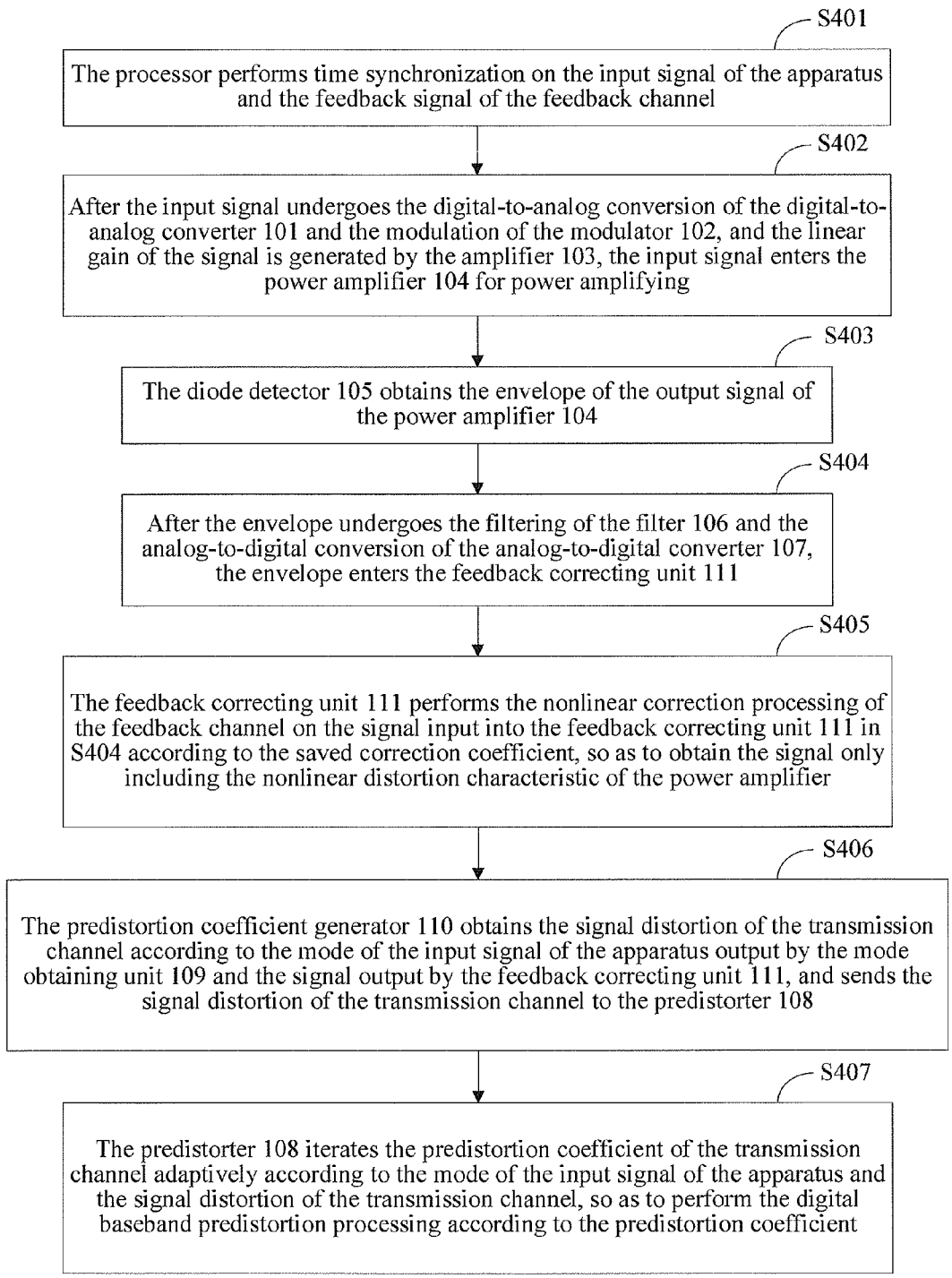
FIG. 4 is a flow chart of a method for digital baseband predistortion provided by an embodiment of the present invention.

After the correction coefficient of the diode detector is obtained, the output power of the power amplifier 104 may be adjusted to the nonlinear interval, so as to perform the digital baseband predistortion processing. A specific implementation manner is shown in FIG. 4, and the following operations are specifically included:

S401: The processor performs time synchronization on the input signal of the apparatus and the feedback signal of the feedback channel;

S402: After the input signal undergoes the digital-to-analog conversion of the digital-to-analog converter 101 and the modulation of the modulator 102, and the linear gain of the signal is generated by the amplifier 103, the input signal enters the power amplifier 104 for power amplifying;

S403: The diode detector 105 obtains the envelope of the output signal of the power amplifier 104;

S404: After the envelope undergoes the filtering of the filter 106 and the analog-to-digital conversion of the analog-to-digital converter 107, the envelope enters the feedback correcting unit 111;

S405: The feedback correcting unit 111, according to the saved correction coefficient, performs the nonlinear correction processing of the feedback channel on the signal input into the feedback correcting unit 111 in S404, so as to obtain the signal which only has the nonlinear distortion characteristic of the power amplifier;

S406: The predistortion coefficient generator 110 obtains the signal distortion of the transmission channel according to the mode of the input signal of the apparatus output by the mode obtaining unit 109 and the signal output by the feedback correcting unit 111, and sends the signal distortion of the transmission channel to the predistorter 108;

the signal distortion may be represented by an envelope error: $e(n) = \sqrt{I_1(n)^2 + Q_1(n)^2} - \sqrt{I(n)^2 + Q(n)^2}$;

S407: The predistorter 108 iterates the predistortion coefficient of the transmission channel adaptively according to the mode of the input signal of the apparatus and the signal distortion of the transmission channel, so as to perform the digital baseband predistortion processing according to the predistortion coefficient.

It is assumed that an input and output model of the predistorter 108 is $$V_0(t) = \sum_{n=0}^{\infty} W_n V_i^n(t),$$

where a coefficient matrix $W_n$ is an optimized variable, and a cost function of the envelope error is $J(n) = E(|e(n)|^2)$, then an optimal predistortion coefficient can be obtained by the predistorter 108 through iteration of $W_n(n+1) = W_n(n) + u^* \nabla J(n)_n$, where u is an iteration step size.

All or a part of the steps of the method in the above embodiments may be implemented by a program instructing relevant hardware. The program may be stored in a computer readable storage medium. When the program is run, the steps of the method according to the embodiments are performed. The storage medium may be any medium capable of storing program codes, such as a ROM, a RAM, a magnetic disk or an optical disk.

The foregoing descriptions are merely exemplary embodiments of the present invention, but not intended to limit the protection scope of the present invention. Any variation or replacement readily thought of by persons skilled in the art within the technical scope disclosed by the present invention shall fall within the protection scope of the present invention. Therefore, the protection scope of the present invention shall be subject to the appended claims.

What is claimed is:

1. A method for implementing digital baseband predistortion processing in an apparatus, wherein the apparatus comprises a transmission channel comprising a digital-to-analog converter, a modulator, an amplifier and a power amplifier, wherein the apparatus further comprises a feedback channel analog part comprising a diode detector, a filter and an analog-to-digital converter, and a feedback channel digital part comprising a predistorter, a mode obtaining unit, a predistortion coefficient generator and a feedback correcting unit, the method comprising:

obtaining, by the diode detector in the feedback channel, an output signal of the power amplifier in the transmission channel;

performing detecting, by the diode detector, to obtain an envelope of the output signal of the power amplifier;

performing, by the analog-to-digital converter in the feedback channel, analog-to-digital conversion on the envelope;

performing, by the feedback correcting unit in the feedback channel, nonlinear correcting processing of the feedback channel on a signal output after the analog-to-digital converter performs the analog-to-digital conversion;

obtaining, by the predistortion coefficient generator in the feedback channel, signal distortion of the transmission channel according to a mode of an obtained input signal of the apparatus and a signal output after the feedback correcting unit performs the nonlinear correction process;

performing, by the predistorter in the feedback channel, the digital baseband predistortion processing on the input signal of the apparatus according to the signal distortion of the transmission channel;

wherein, before obtaining, by the diode detector in the feedback channel, the output signal of the power amplifier in the transmission channel, the method further comprises:

controlling an output power of the power amplifier to operate at a linear interval;

obtaining a nonlinear distortion parameter of the diode detector; and obtaining a correction coefficient of the diode detector according to the nonlinear distortion parameter;

wherein obtaining the nonlinear distortion parameter of the diode detector comprises:

obtaining the mode of the input signal of the apparatus;

obtaining a digital signal after the analog-to-digital conversion is performed on the envelope of the output signal while the power amplifier operates at the linear interval; and determining a nonlinear transfer function of the diode detector according to the mode of the input signal and the digital signal that is obtained after the analog-to-digital conversion is performed on the envelope, wherein the nonlinear transfer function is the nonlinear distortion parameter.

2. The method according to claim 1, wherein after obtaining the correction coefficient of the diode detector, the method further comprises:

adjusting a transmission power of the power amplifier to a nonlinear interval.

3. The method according to claim 2, wherein performing, by the feedback correcting unit in the feedback channel, the nonlinear correcting processing of the feedback channel on the envelope comprises:

correcting, by the feedback correcting unit, nonlinear distortion of the diode detector in the envelope according to the correction coefficient of the diode detector.

4. The method according to claim 1, wherein time synchronization is performed on the input signal of the apparatus and a feedback signal output by the predistorter.

* * * * *